(12) United States Patent
Katoch et al.

(10) Patent No.: US 10,157,664 B2
(45) Date of Patent: Dec. 18, 2018

(54) MEMORY CONTROLLING DEVICE BY USING MULTI-PHASE CONTROL SIGNAL AND METHOD THEREOF

(71) Applicant: TAIWAN SEMICONDUCTOR MANUFACTURING COMPANY LTD., Hsinchu (TW)

(72) Inventors: Atul Katoch, Kanata (CA); Sergiy Romanovskyy, Ottawa (CA)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 26 days.

(21) Appl. No.: 15/190,623

(22) Filed: Jun. 23, 2016

(65) Prior Publication Data
US 2017/0372772 A1 Dec. 28, 2017

(51) Int. Cl.
G11C 11/419 (2006.01)
G11C 11/418 (2006.01)
G11C 7/12 (2006.01)
G11C 8/08 (2006.01)

(52) U.S. Cl.
CPC ........ G11C 11/419 (2013.01); G11C 11/418 (2013.01); G11C 7/12 (2013.01); G11C 8/08 (2013.01)

(58) Field of Classification Search
CPC .................................................. G11C 11/419
USPC ........... 365/189.02, 189.04, 189.15, 189.14, 365/189.2
See application file for complete search history.

(56) References Cited

U.S. PATENT DOCUMENTS

| | | | |
|---|---|---|---|
| 8,605,523 B2 | 12/2013 | Tao et al. | |
| 8,630,132 B2 | 1/2014 | Cheng et al. | |
| 8,760,948 B2 | 6/2014 | Tao et al. | |
| 8,908,421 B2 | 12/2014 | Liaw | |
| 8,929,160 B2 | 1/2015 | Katoch et al. | |
| 8,964,492 B2 | 2/2015 | Hsu et al. | |
| 8,982,643 B2 | 3/2015 | Lum | |
| 9,117,510 B2 | 8/2015 | Yang et al. | |
| 9,208,858 B1 | 12/2015 | Lin et al. | |
| 9,218,872 B1 | 12/2015 | Liaw | |
| 2013/0100730 A1* | 4/2013 | Chang | G11C 11/418 365/154 |
| 2014/0036610 A1* | 2/2014 | Ramamurthy | G11C 7/12 365/203 |
| 2014/0119103 A1* | 5/2014 | Lee | G11C 11/412 365/154 |
| 2014/0153345 A1 | 6/2014 | Kim et al. | |
| 2014/0233330 A1 | 8/2014 | Ko et al. | |
| 2015/0348598 A1 | 12/2015 | Wang et al. | |
| 2015/0371702 A1 | 12/2015 | Wu et al. | |
| 2015/0380077 A1 | 12/2015 | Wu et al. | |
| 2015/0380078 A1 | 12/2015 | Liaw | |

* cited by examiner

Primary Examiner — Alexander Sofocleous
Assistant Examiner — Alfredo Bermudez Lozada
(74) Attorney, Agent, or Firm — WPAT, P.C., Intellectual Property Attorneys; Anthony King

(57) ABSTRACT

A memory controlling device includes: a control circuit arranged to generate a multi-pulse control signal with a first duration; and a memory cell coupled to a pair of bit lines and a word line, wherein the multi-pulse control signal is coupled to the word line, and the memory cell is arranged to output an output signal on the pair of bit lines during the first duration.

18 Claims, 6 Drawing Sheets

MEMORY CONTROLLING DEVICE BY USING MULTI-PHASE CONTROL SIGNAL AND METHOD THEREOF

A static random access memory (SRAM) is a memory device commonly employed as internal storage areas in a computer or other electronic equipment. An SRAM is a volatile memory device in that once power is turned off, all data stored in the SRAM is lost. SRAM has the advantage of holding data without the need for refreshing. To maintain the stability of SRAM cells, the design of SRAM is a compromise between read and write functions. Moreover, as operating voltage reduces, the static noise margin (SNM) of SRAM cell degrades.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
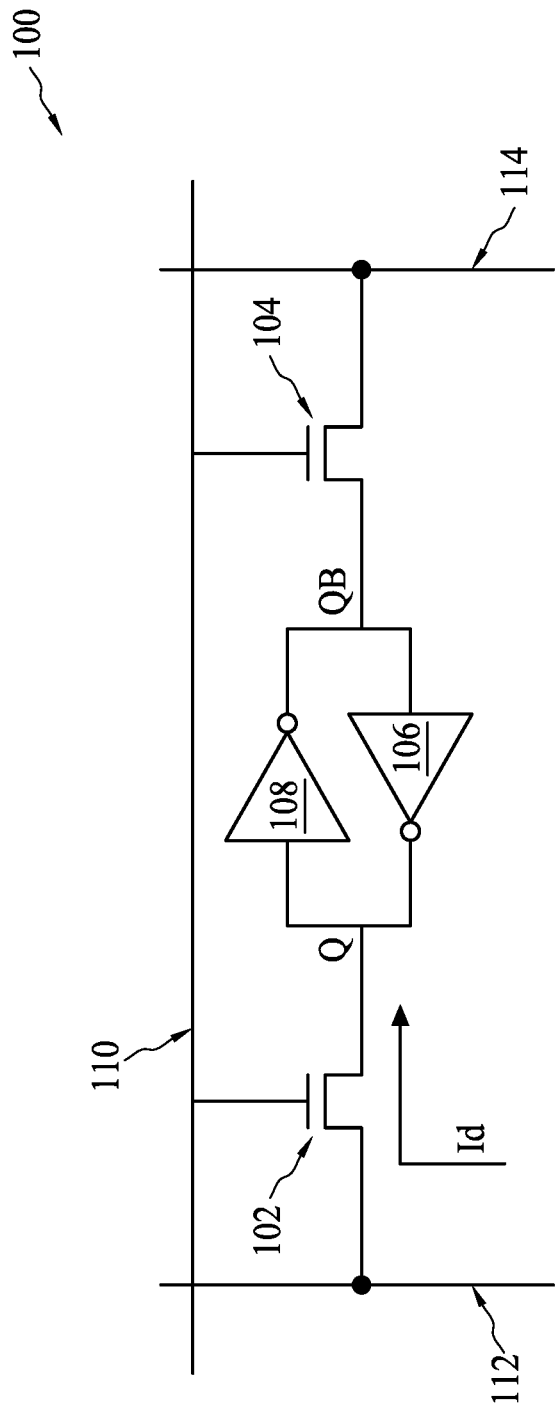
FIG. 1 is a circuit diagram of a memory cell in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a circuit diagram of a memory cell 100 in accordance with some embodiments. The memory cell 100 may be a static random access memory (SRAM) cell. In addition, the SRAM cell may be used in ultra-low voltage applications. Referring to FIG. 1, the memory cell 100 comprises a first switch 102, a second switch 104, a first inverter 106, and a second inverter 108. The first switch 102 includes an N-channel metal-oxide-semiconductor (NMOS) transistor. The first switch 102 has a control terminal coupled to a word line 110, a first connecting terminal coupled to a first bit line 112, and a second connecting terminal, i.e., the data terminal Q, coupled to an input terminal of the first inverter 106 and to an output terminal of the second inverter 108. The second switch 104 includes an NMOS transistor. The second switch 104 has a control terminal coupled to the word line 110, a first connecting terminal coupled to a second bit line 114, and a second connecting terminal, i.e., the data terminal QB, coupled to an input terminal of the second inverter 108 and to an output terminal of the first inverter 106. In the present embodiment, the first inverter 106 is cross-coupled to the second inverter 108. The first inverter 106 and the second inverter 108 are arranged to latch a first logical state and a second logical state at the terminals Q and QB, respectively. The first logical state and the second logical state are complementary. According to some embodiments, when the terminal Q is latched to a logical high level, the terminal QB is latched to a logical low level. When the terminal Q is latched to a logical low level, the terminal QB is latched to a logical high level.

According to some embodiments, the terminal Q is latched to the logical low level (e.g., the ground voltage Vgnd), and the terminal QB is latched to the logical high level (e.g., the supply voltage Vdd). During a read cycle, the voltage levels of the first bit line 112 and the second bit line 114 of the memory cell 100 are first driven to a first relatively high voltage level. Then, the word line 110 is driven to a second relatively high voltage level to turn on the first switch 102 and the second switch 104. The first relatively high voltage level and the second relatively high voltage level may be the supply voltage Vdd. However, this is not a limitation of the embodiments. The first relatively high voltage level may be different from the second relatively high voltage level. When the first switch 102 and the second switch 104 are turned on, the first bit line 112 is discharged from the high voltage level VH (e.g., the supply voltage Vdd) to the low voltage level VL (e.g., the ground voltage Vgnd) as the terminal Q is latched to the logical low level. The voltage level of the second bit line 112 is kept intact (i.e., the high voltage level VH) as the terminal QB is latched to the logical high level.

According to some embodiments, when the first bit line 112 is discharged from the high voltage level VH to the low voltage level VL, the voltage level at the terminal Q may be slightly increased from the low voltage level VL by the discharging current Id flowing to the terminal Q from the first bit line 112. If the memory cell 100 is a stable cell, the increased voltage at the terminal Q may quickly be latched or discharged to the low voltage level VL again. However, if the memory cell 100 is an unstable cell with a relatively low static noise margin (SNM), especially in a low or ultra-low supply voltage environment, the increased voltage at the terminal Q may disturb the logical state latched by the first inverter 104 and the second inverter 106. For the unstable cell, the increased voltage may flip the logical states latched by the first inverter 104 and the second inverter 106 if the increased voltage at the terminal Q is higher than a tolerable voltage. When the logical states latched by the first inverter 104 and the second inverter 106 are flipped during the read cycle, the reading operation of the memory cell 100 fails.

Figure 2:
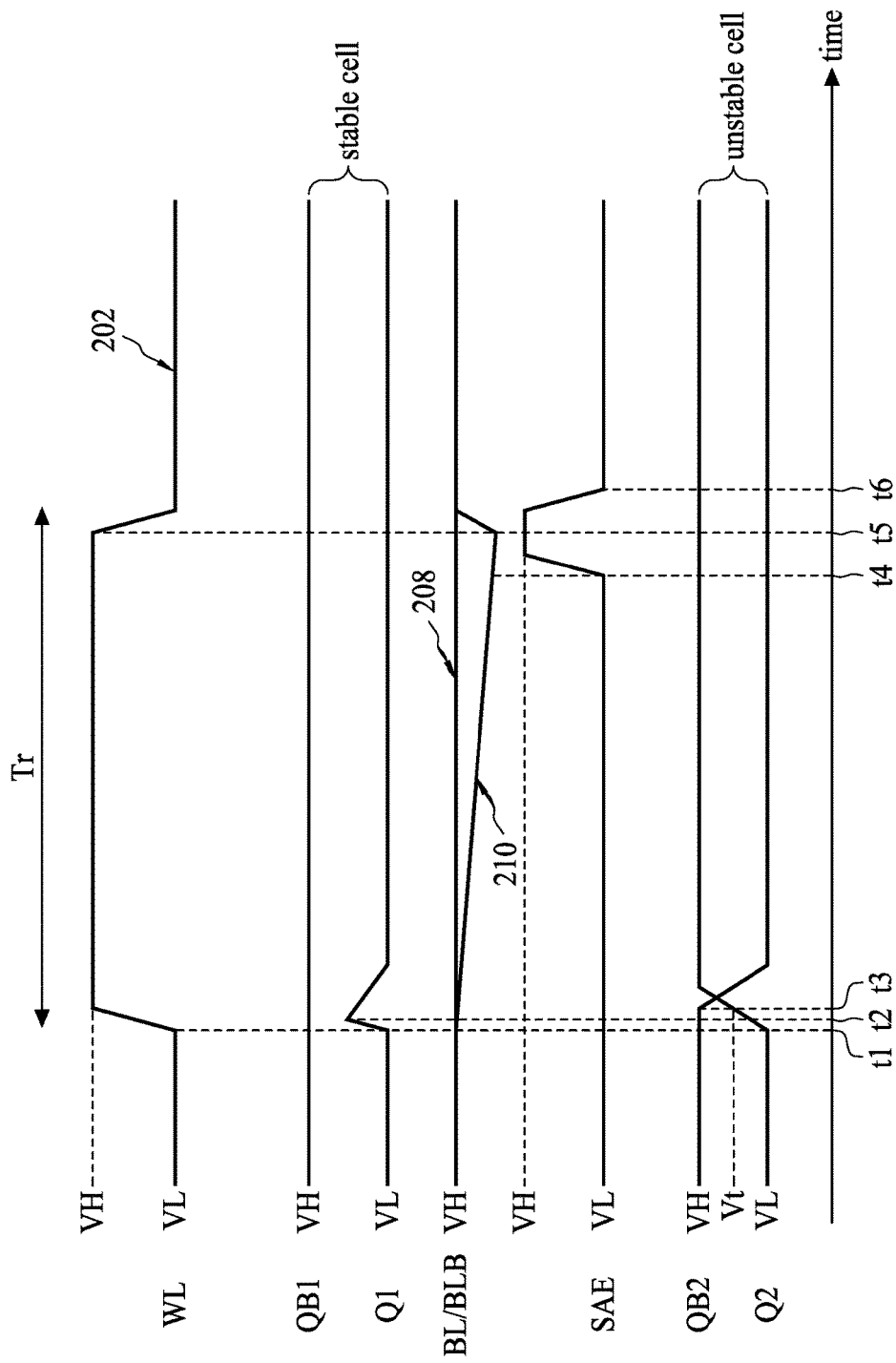
FIG. 2 is a timing diagram illustrating operation of the memory cell of FIG. 1 according to some embodiments.

FIG. 2 is a timing diagram illustrating operation of the memory cell 100 of FIG. 1. Referring to FIG. 2, a control signal 202 applied to the word line 110, voltage levels Q1 and QB1 at the terminals Q and QB, respectively, in the case of a stable cell, voltage levels BL and BLB of the bit lines 112 and 114 in the case of a stable cell, a sense-amplifier enable (SAE) signal in the case of a stable cell, and voltage levels Q2 and QB2 at terminals Q and QB, respectively, in the case of an unstable cell are shown. The control signal 202 represents the voltage level of the word line 110. According to some embodiments, the control signal 202 of the word line 110 is a single pulse control signal. The control signal 202 is kept at a high voltage level VH during a reading interval Tr of the memory cell 100, spanning from t1 to t6. At time t1, the control signal 202 is asserted with the high voltage level VH. At time t5, the control signal is deasserted with the low voltage level VL, For a stable memory cell, at time t1, the voltage level Q1 at the terminal Q slightly increases from the low voltage level VL by the discharging current Id flowing to the terminal Q from the first bit line 112. At time t2, the increased voltage is latched to the low voltage level VL again. When the voltage levels at the terminals Q and QB are latched to the high voltage level VH and the low voltage level VL, respectively, during the reading interval Tr, the voltage level of the first bit line 112 decreases gradually from the high voltage level VH (as shown by line 210) while the voltage level of the first bit line 112 is kept intact (as shown by line 208). When the differential voltage between the first bit line 112 and the second bit line 114 is large enough to control a sense-amplifier (not shown), which is coupled to the first bit line 112 and the second bit line 114, the SAE signal is asserted with the high voltage level VH at time t4. Then, at time t5 the control signal 202 is deasserted, the voltage level of the control signal 202 drops to the low voltage level VL from the high voltage level VH. At time t6, the voltage level of the SAE signal is deasserted, and the reading operation of the memory cell 100 is completed.

However, for an unstable memory cell with relatively low SNM, the cross-coupled inverters 106, 108 may not timely latch the increased voltage to the low voltage level VL at time t2, and the voltage level Q2 at the terminal Q may continue to increase and become higher than the tolerable voltage Vt by the discharging current Id at time t4. Then, the voltage level QB2 at the terminal QB decreases from the high voltage level VH to the low voltage level VL, and the voltage level Q2 at the terminal Q increases to reach the high voltage level VH. As a result, the logical states latched by the first inverter 104 and the second inverter 106 are flipped during the read cycle, and the reading operation of the memory cell 100 fails.

Figure 3:
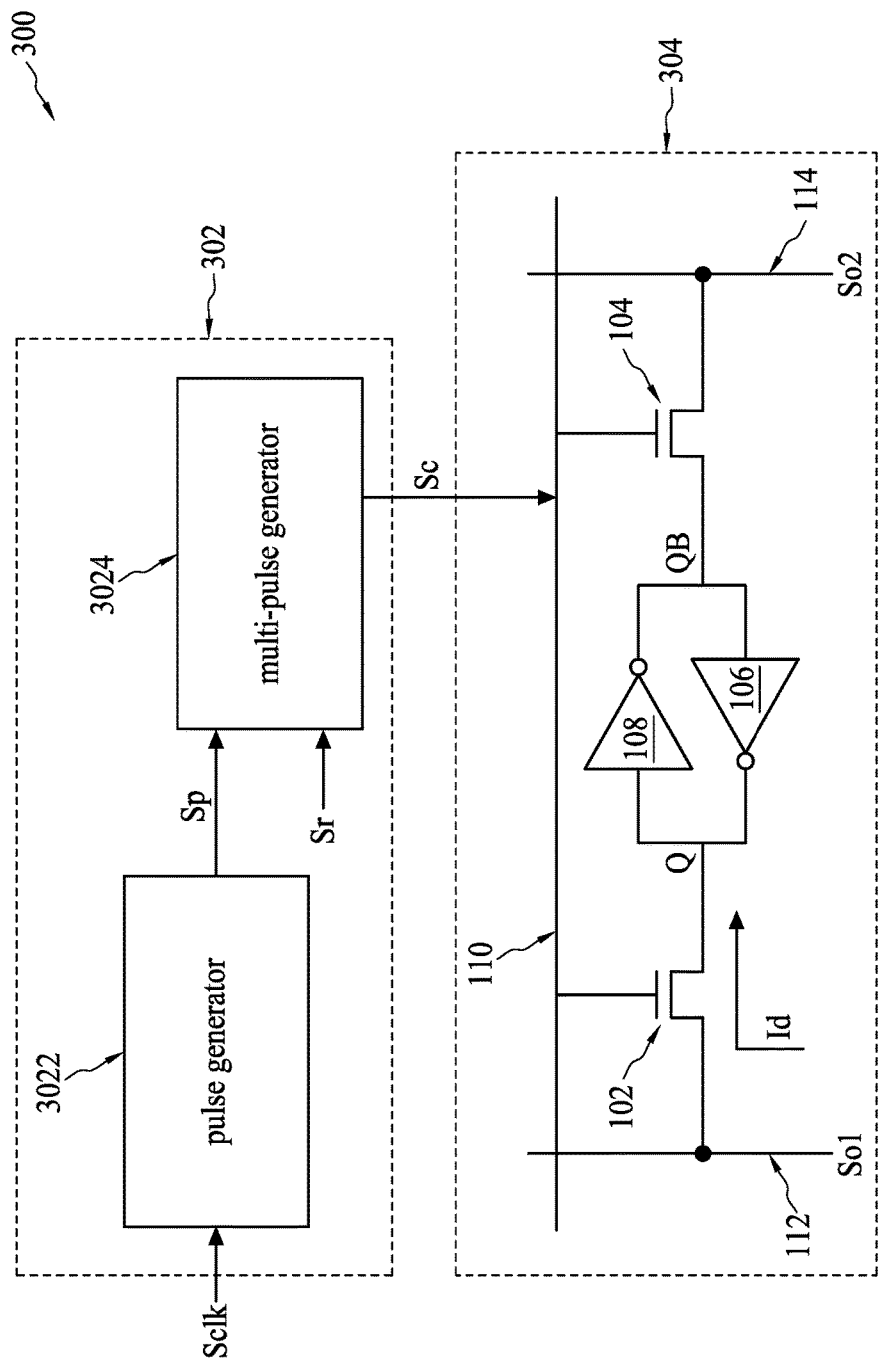
FIG. 3 is a diagram illustrating a memory controlling device according some embodiments.

According to some embodiments, to solve the degradation problem of SNM of the memory cell 100 under the low or ultra-low supply voltage environment, a control signal for the word line 110 is designed to be a multi-pulse control signal instead of the single-pulse control signal 202. FIG. 3 is a diagram illustrating a memory controlling device 300 according to some embodiments. Referring to FIG. 3, the memory controlling device 300 comprises a control circuit 302 and a memory cell 304. The control circuit 302 is arranged to generate a reading control signal and send the same to a word line of the memory cell 304 for reading the memory cell 304 during a read cycle of the memory cell 304. The reading control signal is a multi-pulse control signal Sc with a first duration T1. The memory cell 304 has a similar configuration to the memory cell 100, and the detailed description of the memory cell 304 is omitted here for brevity. The memory cell 304 is coupled to a pair of bit lines 112, 114 and a word line 110. The control circuit 302 is coupled to the word line 110 for applying the multi-pulse control signal Sc to the word line 110, and the memory cell 304 is arranged to output an output signal So on the pair of bit lines 112, 114 during the first duration T1 of the multi-pulse control signal Sc. The output signal So is a differential signal of a first output signal So1 of the first bit line 112 and a second output signal So2 of the second bit line 114.

According to some embodiments, the control circuit 302 comprises a pulse generator 3022 and a multi-pulse generator 3024. The pulse generator 3022 is arranged to generate a single-pulse control signal Sp with a second duration T2 according to the clock signal Sclk. The multi-pulse generator 3024 is arranged to generate the multi-pulse control signal Sc according to the single-pulse control signal Sp and a read signal Sr. The read signal Sr is arranged to enable the control circuit 302 to generate the multi-pulse control signal Sc. The multi-pulse control signal Sc is arranged to periodically switch between a first voltage level and a second voltage level different from the first voltage level in the first duration T1. For brevity, the first voltage level is the high voltage level VH (e.g., the supply voltage Vdd) and the second voltage level is the low voltage level VL (e.g., the ground voltage Vgnd).

Figure 4:
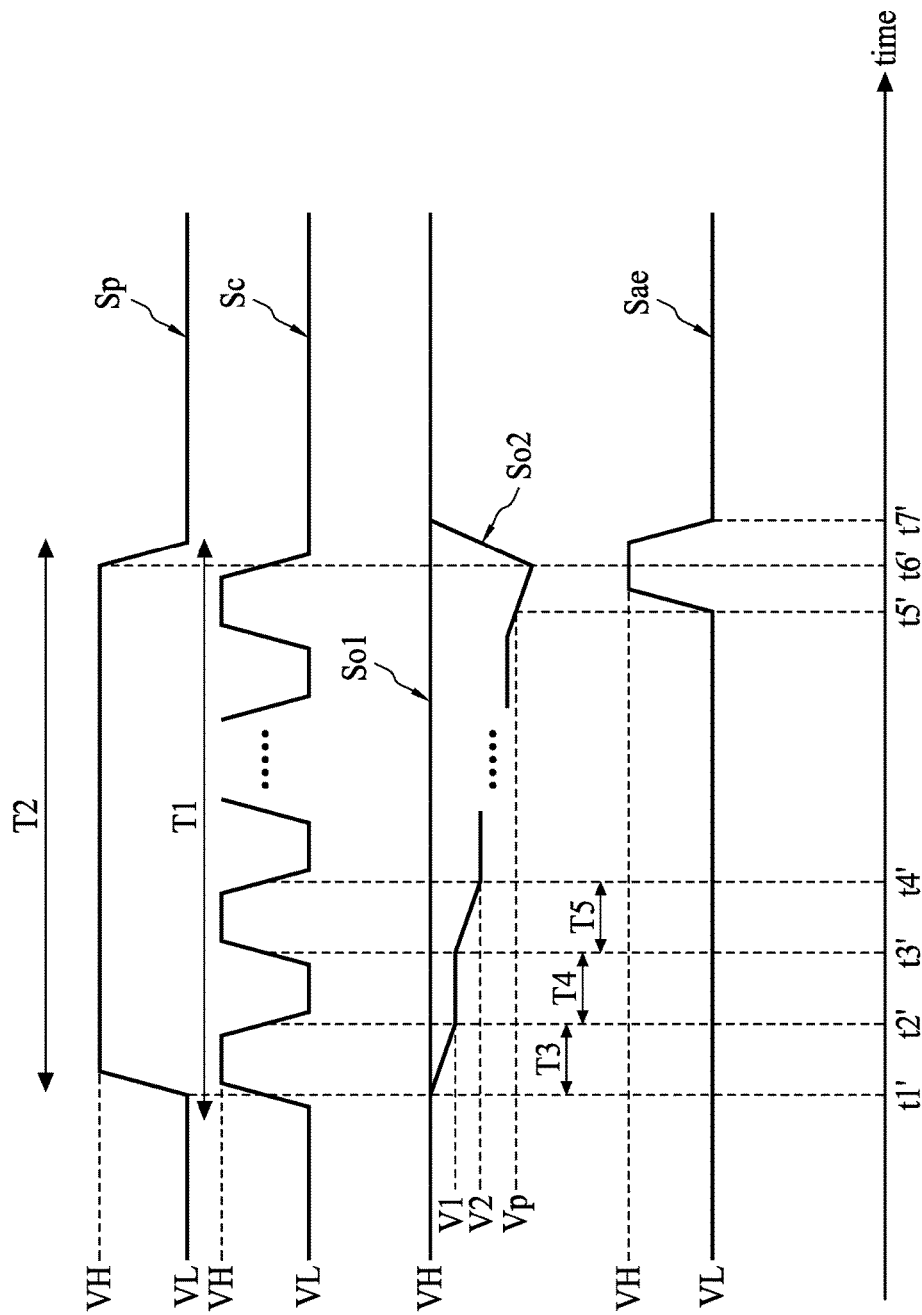
FIG. 4 is a timing diagram illustrating a single-pulse control signal, a multi-pulse control signal, a first output signal, a second output signal, and a sense-amplifier enable signal of the memory controlling device of FIG. 3 according to some embodiments.

FIG. 4 is a timing diagram illustrating the single-pulse control signal Sp, the multi-pulse control signal Sc, the first output signal So1, the second output signal So2, and a sense-amplifier enable (SAE) signal Sae according to some embodiments. Referring to FIG. 4, the first duration T1 of the multi-pulse control signal Sc substantially equals the second duration T2 of the single-pulse control signal Sp. For brevity, the terminal Q is latched to the logical low level (i.e., the low voltage level VL), and the terminal QB is latched to the logical high level (i.e., the high voltage level VH). However, this is not a limitation of the embodiments. During the read cycle, the voltage levels of the first bit line 112 and the second bit line 114 of the memory cell 100 are precharged to the high voltage level VH. However, this is not a limitation of the embodiments. For example, the voltage levels of the first bit line 112 and the second bit line 114 of the memory cell 100 may be pre-discharged to the low voltage level VL during the read cycle. At time t1', the voltage level of the single-pulse control signal Sp is switched to the high voltage level VH from the low voltage level VL. The read signal Sr enables the multi-pulse generator 3024 to generate the multi-pulse control signal Sc according to the single-pulse control signal Sp. At time t1', the voltage level of the multi-pulse control signal Sc is also switched to the high voltage level VH from the low voltage level VL to turn on the first switch 102 and the second switch 104. During the interval T3, the first switch 102 and the second switch 104 are turned on, and the voltage level of the first bit line 112 (i.e., So1) gradually decreases from the high voltage level VH by the discharging current Id flowing to the terminal Q from the first bit line 112 while the voltage level of the second bit line 114 (i.e., So2) is kept intact on the high voltage level VH, This is because, in the embodiments, the terminal Q is latched to the low voltage level VL and the terminal QB is latched to the high voltage level VH. Accordingly, the signal on the first bit line 112 is a ramp down signal and the signal on the second bit line 114 is a flat signal during the interval T3, In other words, the output signal So is a differential ramp signal during the interval T3. As previously discussed and illustrated with reference to FIG. 2, the discharging current Id may slightly increase the voltage level of the terminal Q. The increased voltage at the terminal Q may flip the logical state latched by the first inverter 104 and the second inverter 106.

To avoid the logical state of the memory cell 100 being flipped by the increased voltage at the terminal Q, at time t2', the voltage level of the multi-pulse control signal Sc is switched to the low voltage level VL from the high voltage level VH. Then, the first switch 102 and the second switch 104 are turned off for an interval T4. When the first switch 102 and the second switch 104 are turned off, the voltage levels of the ramp signal and the flat signal on the first bit line 112 and the second hit line 114 are kept intact. In other words, the voltage level of the first bit line 112 (i.e., So1) is held at the current voltage level V1 while the voltage level of the second bit line 114 (i.e., So2) is still kept at the high voltage level VH. In other words, the output signal So is a differential flat signal during the interval T4. As the first switch 102 and the second switch 104 are opened during the interval T4, the first inverter 106 and the second inverter 108 are decoupled from the bit lines 112 and 114, and the discharging current Id does not flow to the terminal Q from the first hit line 112. Accordingly, during the interval T4, the first inverter 106 and the second inverter 108 may restore or latch the voltage level on the terminal Q into the low voltage level VL again.

Then, at time t3', the voltage level of the multi-pulse control signal Sc is switched to the high voltage level VH from the low voltage level VL to turn on the first switch 102 and the second switch 104 again. During the interval T5, the first switch 102 and the second switch 104 are turned on, and the voltage level of the first bit line 112 (i.e., So1) gradually decreases from the voltage level V1 by the discharging current Id flowing to the terminal Q from the first bit line 112 while the voltage level of the second bit line 114 (i.e., So2) is kept intact on the high voltage level VH. Therefore, the signal on the first bit line 112 is a ramp down signal and the signal on the second bit line 114 is a flat signal during the interval T5. In other words, the output signal So is a differential ramp signal during the interval T5. Similarly, the discharging current Id may slightly increase the voltage level at the terminal Q. The increased voltage at the terminal Q may flip the logical state latched by the first inverter 104 and the second inverter 106.

To avoid the logical state of the memory cell 100 being flipped by the increased voltage at the terminal Q, at time t4', the voltage level of the multi-pulse control signal Sc is switched to the low voltage level VL from the high voltage level VH. Then, the first switch 102 and the second switch 104 are turned off for an interval T6. When the first switch 102 and the second switch 104 are turned off, the voltage levels of the ramp signal and the flat signal on the first bit line 112 and the second bit line 114 are kept intact. In other words, the voltage level of the first hit line 112 (i.e., So1) is held at the current voltage level V2 while the voltage level of the second bit line 114 (i.e., So2) is still kept at the high voltage level VH. In other words, the output signal So is a differential flat signal during the interval T6. Similarly, as the first switch 102 and the second switch 104 are opened during the interval T6, the first inverter 106 and the second inverter 108 are decoupled from the bit lines 112 and 114, and the discharging current Id does not flow to the terminal Q from the first bit line 112. Accordingly, during the interval T6, the first inverter 106 and the second inverter 108 may restore or latch the voltage level on the terminal Q into the low voltage level VL again.

Accordingly, by repeating the above discharging-and-restoring process caused by the multi-pulse control signal Sc, the voltage level of the first bit line 112 (i.e., So1) ramps down in a discontinuous way. At time t5', the differential voltage level (i.e., So) between the first bit line 112 and the second bit line 114 is large enough to activate the sense-amplifier (not shown), which is coupled to the first bit line 112 and the second bit line 114, to switch the voltage level of the SAE signal Sae to the high voltage level VH from the low voltage level VL. For example, the differential voltage level may be a predetermined voltage Vp. Then, at time t6', the voltage level of the multi-pulse control signal Sc is switched back to the low voltage level VL from the high voltage level VH. At time t7', the voltage level of the SAE signal Sae is switched to the low voltage level VL from the high voltage level VH, and the reading operation of the memory cell 100 is completed.

According to the embodiments, during the read cycle of the memory cell 100, the voltage level of the first output signal So1 is ramped and held in accordance with the voltage level of the multi-pulse control signal Sc while the voltage level of the second output signal So2 is held at the high voltage level VH. When the voltage level of the multi-pulse control signal Sc is the high voltage level VH, the first output signal So1 is a ramp signal. When the voltage level of the multi-pulse control signal Sc is the low voltage level VL, the first output signal So1 is a flat signal. Therefore, the differential output signal So of the first output signal So1 and the second output signal So2 is a discontinuous ramp signal instead of a continuous ramp signal during the read cycle (i.e. the first duration T1) of the memory cell 100.

Accordingly, when the control signal of the word line 110 is a multi-pulse control signal (i.e., Sc), the memory cell 100 is able to restore the latched logical state before being flipped by the electric charges from the bit line during the read cycle. Therefore, the memory controlling device 300 has a relatively high static noise margin (SNM) under the low or ultra-low supply voltage environment.

Figure 5:
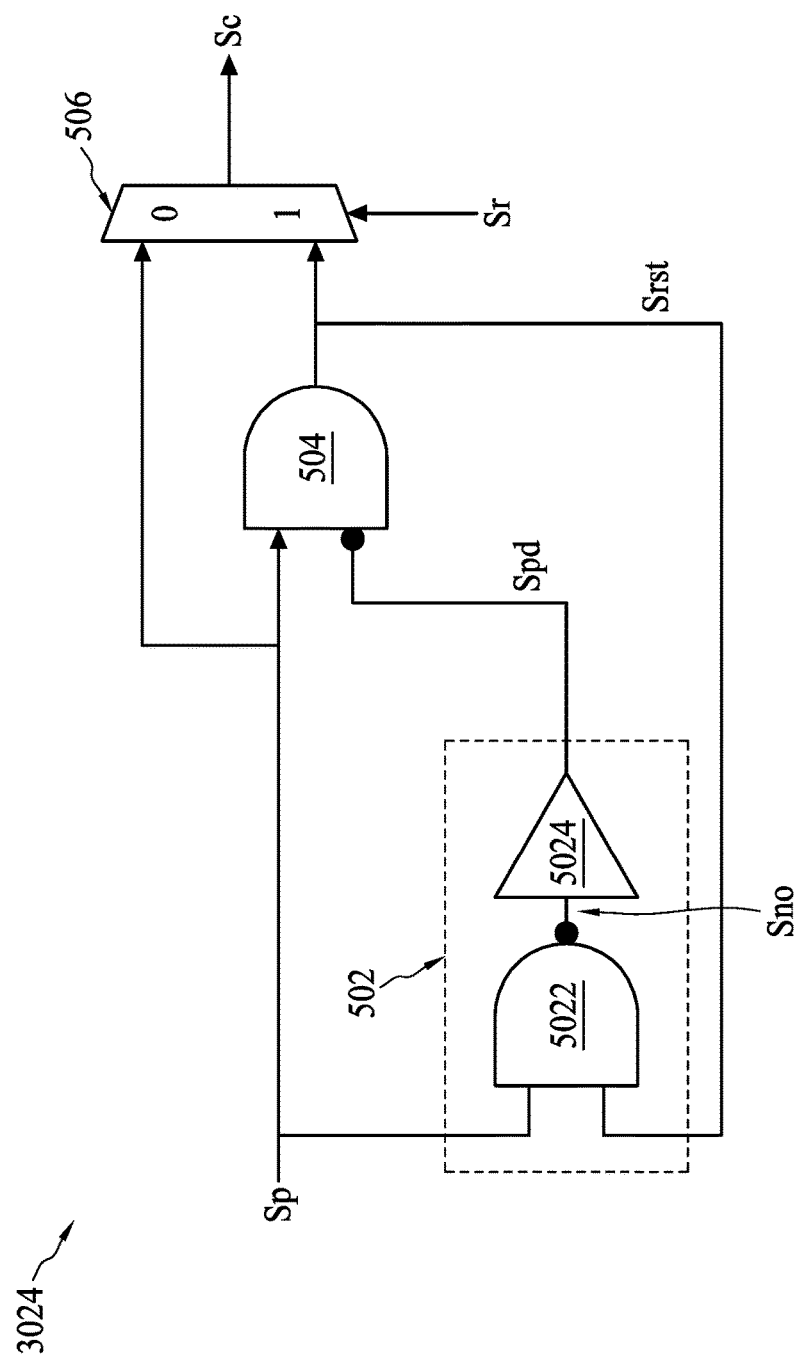
FIG. 5 is a diagram illustrating a multi-pulse generator of the memory controlling device of FIG. 3 according to some embodiments.

FIG. 5 is a diagram illustrating the multi-pulse generator 3024 according to some embodiments. The multi-pulse generator 3024 comprises a delay circuit 502, an AND gate 504, and a multiplexer 506. The delay circuit 502 is arranged to delay a single-pulse control signal Sp so as to generate a delayed control signal Spd according to a reset signal Srst. The AND gate 504 is arranged to generate the reset signal Srst according to the single-pulse control signal Sp and the delayed control signal Spd. The multiplexer 506 has a first input and a second input for receiving the single-pulse control signal Sp and the reset signal Srst, respectively. The multiplexer 506 is arranged to selectively output the single-pulse control signal Sp or the reset signal Srst as the multi-pulse control signal Sc according to the read signal Sr. For example, when the voltage level of the read signal Sr is the high voltage level VH during the read cycle, the multiplexer 506 is arranged to output the reset signal Srst as the multi-pulse control signal Sc. When the voltage level of the read signal Sr is the low voltage level VL during the non-reading operation, the multiplexer 506 is arranged to output the single-pulse control signal Sp as the multi-pulse control signal Sc.

According to some embodiments, the AND gate 504 is arranged to generate the reset signal Srst by receiving the single-pulse control signal Sp and an inversed signal of the delayed control signal Spd.

According to some embodiments, the delay circuit 502 comprises a NAND gate 5022 and an inverter 5024. The NAND gate 5022 is arranged to generate a NAND output signal Sno according to the single-pulse control signal Sp and the delayed control signal Srst. The inverter 5024 is arranged to generate the delayed control signal Spd according to the NAND output signal Sno. The delay time of the delay circuit 502 is a total of the delay times caused by the NAND gate 5022 and the inverter 5024. However, this is not a limitation of the present embodiments. The delay time of the delay circuit 502 may be adjusted by the number of the inverter 5024. When more serially connected inverters 5024 are applied, the delay time of the delay circuit 502 is longer, and vice versa. The delay time of the delay circuit 502 substantially equals the duration (i.e., T3) of the high voltage level VH of the multi-pulse control signal Sc or the duration (i.e., T4) of the low voltage level VL of the multi-pulse control signal Sc. In other words, the delay time of the delay circuit 502 is a half of the period of the multi-pulse control signal Sc. According to some embodiments, to avoid the logical state of the memory cell 100 being flipped by the increased voltage at the terminal Q during the read cycle, the delay time of the delay circuit 502 is designed to be shorter than the time need for charging the voltage level at the terminal Q to be higher than the tolerable voltage Vt by the discharging current Id.

Figure 6:
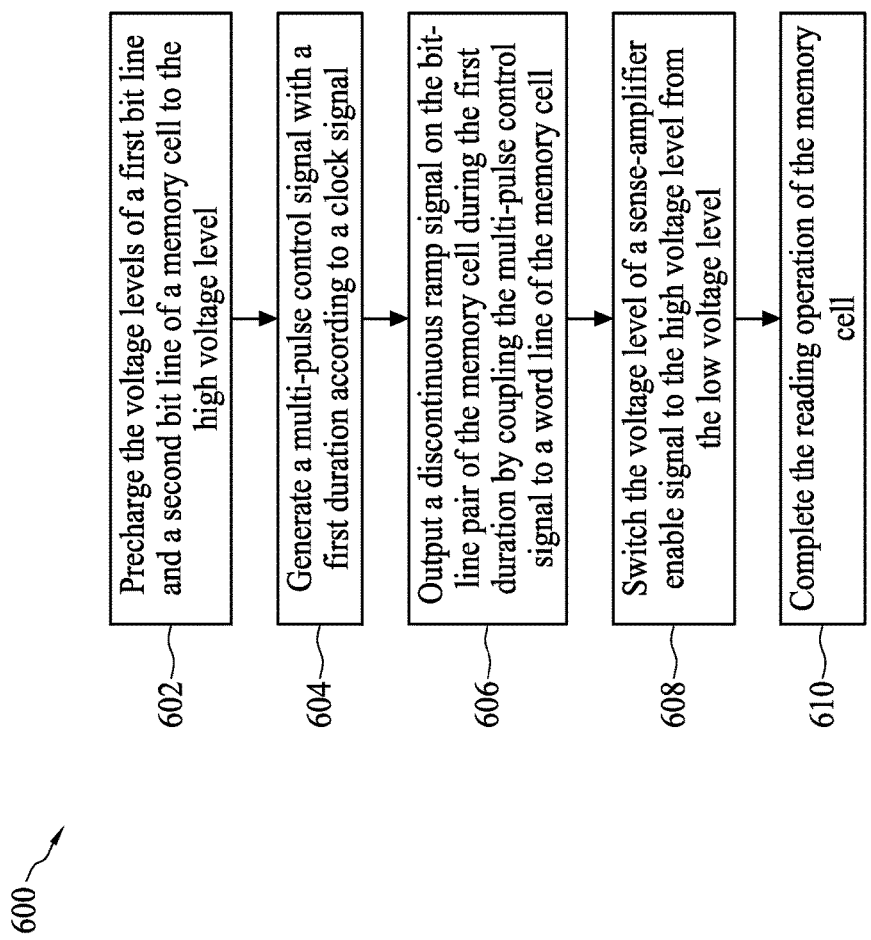
FIG. 6 is a flow diagram illustrating a memory controlling method in accordance with some embodiments.

FIG. 6 is a flow diagram illustrating a memory controlling method 600 in accordance with some embodiments. The memory controlling method 600 is arranged to control a memory cell, such as an SRAM cell, during a read cycle. For brevity, the memory controlling method 600 is described in conjunction with the memory controlling device 300. In addition, the terminal Q is latched to the logical low level (i.e., the low voltage level VL), and the terminal QB is latched to the logical high level (i.e., the high voltage level VH). Referring to FIG. 6, in operation 602, the voltage levels of the first bit line 112 and the second bit line 114 of the memory cell 100 are precharged to the high voltage level VH.

In operation 604, the multi-pulse control signal Sc with the first duration T1 is generated according to the clock signal Sclk.

In operation 606, the memory cell 100 is arranged to output the output signal So on the pair of bit lines 112, 114 of the memory cell 100 during the first duration T1 by coupling the multi-pulse control signal Sc to the word line 110 of the memory cell 100. The multi-pulse control signal Sc periodically switches between the high voltage level VH and the low voltage level VL in the first duration T1. When the multi-pulse control signal Sc is the high voltage level VH, the memory cell 100 discharges the first bit line 112 to generate a ramp signal while the voltage level of the second bit line 114 is kept at the high voltage level VH. When the multi-pulse control signal Sc is the low voltage level VL, the voltage level of the first bit line 112 is held at the current voltage level V1 (i.e., a flat signal) while the voltage level of the second bit line 114 is still the high voltage level VH. Accordingly, the output signal So, which is a differential signal between the first bit line 112 and the second bit line 114, is a discontinuous ramp signal during the first duration T1.

In operation 608, a sense-amplifier (not shown), which is coupled to the first bit line 112 and the second bit line 114, switches the voltage level of the SAE signal to the high voltage level VH from the low voltage level VL when the differential voltage between the first bit line 112 and the second bit line 114 is larger than a predetermined voltage level.

In operation 610, the reading operation of the memory cell 100 is completed.

Briefly, according to the present embodiments, the control signal of the word line of an SRAM cell is designed to be a multi-pulse control signal during the read cycle. When the control signal of the word line is the multi-pulse control signal, the SRAM cell is able to restore the latched logical state before being flipped by the electric charges from the bit line during the read cycle. Therefore, the SRAM cell has a relatively high static noise margin (SNM) under the low or ultra-low supply voltage environment.

In some embodiments of the present disclosure, a memory controlling device comprises a control circuit and a memory cell. The control circuit is arranged to generate a multi-pulse control signal with a first duration. The memory cell is coupled to a pair of bit lines and a word line. The multi-pulse control signal is coupled to the word line, and the memory cell is arranged to output an output signal on the pair of bit lines during the first duration.

In some embodiments of the present disclosure, a memory controlling device comprises a memory cell and a control circuit. The memory cell has a first data terminal and a second data terminal coupled to a first bit line and a second bit line respectively. The control circuit is arranged to generate a reading control signal to a word line of the memory cell for reading the memory cell during a read cycle of the memory cell. When the reading control signal is a first voltage level, the memory cell is arranged to discharge the first bit line via the first data terminal to generate a ramp signal on the first bit line and to hold the second bit line via the second data terminal to generate a flat signal on the second bit line, and when the reading control signal is a second voltage level different from the first voltage level, voltage levels of the ramp signal and the flat signal on the first bit line and the second bit line are kept intact respectively.

In some embodiments of the present disclosure, a memory controlling method comprises: generating a multi-pulse control signal with a first duration; and arranging a memory cell to output an output signal on a pair of bit lines of the memory cell during the first duration by coupling the multi-pulse control signal to a word line of the memory cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A memory controlling device, comprising:
a control circuit, arranged to generate a multi-pulse control signal with a first duration; and
a memory cell, coupled to a pair of bit lines and a word line, wherein the multi-pulse control signal is coupled to the word line, and the memory cell is arranged to output an output signal on the pair of bit lines during the first duration;

wherein the multi-pulse control signal has multiple pulses periodically switching between a first voltage level and a second voltage level different from the first voltage level in the first duration, and the first duration is a read cycle of the memory cell, the pair of bit lines is coupled to the memory cell when the multi-pulse control signal has the first voltage level during the read cycle, and the pair of bit lines is decoupled from the memory cell when the multi-pulse control signal has the second voltage level during the read cycle, the control circuit comprises:

a delay circuit, arranged to delay a single-pulse control signal to generate a delayed control signal according to a reset signal;

an AND gate, arranged to generate the reset signal according to the single-pulse control signal and the delayed control signal; and a multiplexer, arranged to generate the multi-pulse control signal according to the single-pulse control signal or the reset signal.

2. The memory controlling device of claim 1, wherein the memory cell controls the pair of bit lines to generate a differential ramp signal when the multi-pulse control signal is the first voltage level, and voltage levels of the pair of bit lines are kept intact to generate a differential flat signal when the multi-pulse control signal is the second voltage level.

3. The memory controlling device of claim 1, wherein the control circuit further comprises:

a pulse generator, arranged to generate the single-pulse control signal with a second duration according to a clock signal.

4. The memory controlling device of claim 3, wherein the first duration of the multi-pulse control signal substantially equals the second duration of the single-pulse control signal.

5. The memory controlling device of claim 3, wherein the multiplexer has a first input and a second input for receiving the single-pulse control signal and the reset signal respectively, and is arranged to selectively output the single-pulse control signal or the reset signal to be the multi-pulse control signal according to a read signal.

6. The memory controlling device of claim 1, wherein the AND gate is arranged to generate the reset signal by receiving the single-pulse control signal and an inversed signal of the delayed control signal.

7. The memory controlling device of claim 1, wherein the delay circuit comprises:

a NAND gate, arranged to generate a NAND output signal according to the single-pulse control signal and the delayed control signal; and an inverter, arranged to generate the delayed control signal according to the NAND output signal.

8. The memory controlling device of claim 1, wherein the memory cell comprises:

a first switch, having a control terminal coupled to the multi-pulse control signal, and a first connecting terminal coupled to a first bit line of the pair of bit lines;

a second switch, having a control terminal coupled to the multi-pulse control signal, and a first connecting terminal coupled to a second bit line of the pair of bit lines;

a first inverter, having an input terminal coupled to a second connecting terminal of the first switch, and an output terminal coupled to a second connecting terminal of the second switch; and a second inverter, having an input terminal coupled to the second connecting terminal of the second switch, and an output terminal coupled to the second connecting terminal of the first switch.

9. The memory controlling device of claim 8, wherein the first bit line and the second bit line are coupled to the first connecting terminal of the first switch and the second connecting terminal of the second switch respectively when the multi-pulse control signal is the first voltage level, and the first bit line and the second bit line are decoupled to the first connecting terminal of the first switch and the second connecting terminal of the second switch respectively when the multi-pulse control signal is the second voltage level.

10. The memory controlling device of claim 9, wherein one of the first bit line and the second bit line is discharged to generate a differential ramp signal between the first bit line and the second bit line when the multi-pulse control signal is the first voltage level, and voltage levels of the first bit line and the second bit line are kept intact to generate a differential flat signal between the first bit line and the second bit line when the multi-pulse control signal is the second voltage level.

11. A memory controlling device, comprising:

a memory cell, having a first data terminal and a second data terminal coupled to a first bit line and a second bit line respectively; and a control circuit, arranged to generate a reading control signal to a word line of the memory cell for reading the memory cell during a read cycle of the memory cell;

wherein when the reading control signal is a first voltage level, the memory cell is arranged to discharge the first bit line via the first data terminal to generate a ramp signal on the first bit line and to hold the second bit line via the second data terminal to generate a flat signal on the second bit line, and when the reading control signal is a second voltage level different from the first voltage level, voltage level of the ramp signal on the first bit line is arranged to hold on a current voltage level at which the reading control signal changes to the second voltage level from the first voltage level, and voltage level of the flat signal is kept intact, the control circuit comprises:

a delay circuit, arranged to delay a single-pulse control signal to generate a delayed control signal according to a reset signal;

an AND gate, arranged to generate the reset signal according to the single-pulse control signal and the delayed control signal; and a multiplexer, arranged to generate the read control signal according to the single-pulse control signal or the reset signal.

12. The memory controlling device of claim 11, wherein the reading control signal is a multi-pulse control signal periodically switches between the first voltage level and the second voltage level.

13. The memory controlling device of claim 11, wherein when the reading control signal is the second voltage level, the memory cell is arranged to discharge the first data terminal into a logical low state.

14. The memory controlling device of claim 11, wherein during the read cycle of the memory cell, a differential signal between the first bit line and the second bit line is a discontinuous ramp signal.

15. A memory controlling method, comprising:

generating a multi-pulse control signal with a first duration; and arranging a memory cell to output an output signal on a pair of bit lines of the memory cell during the first duration by coupling the multi-pulse control signal to a word line of the memory cell;

wherein the multi-pulse control signal has multiple pulses periodically switching between a first voltage level and a second voltage level different from the first voltage level in the first duration, and the first duration is a read cycle of the memory cell, and arranging the memory cell to output the output signal on the pair of bit lines of the memory cell during the first duration comprises:

coupling the pair of bit lines to the memory cell when the multi-pulse control signal has the first voltage level during the read cycle, and decoupling the pair of bit lines from the memory cell when the multi-pulse control signal has the second voltage level during the read cycle;

wherein generating the multi-pulse control signal with the first duration comprises:

delaying a single-pulse control signal to generate a delayed control signal according to a reset signal;

generating the reset signal according to the single-pulse control signal and the delayed control signal; and generating the multi-pulse control signal according to the single-pulse control signal or the reset signal.

16. The memory controlling method of claim 15, wherein coupling the pair of bit lines to the memory cell when the multi-pulse control signal is the first voltage level comprises:

arranging the memory cell to controls the pair of bit lines to generate a differential ramp signal when the multi-pulse control signal is the first voltage level; and decoupling the pair of bit lines from the memory cell when the multi-pulse control signal is the second voltage level comprises:

keeping voltage levels of the pair of bit lines intact to generate a differential flat signal when the multi-pulse control signal is the second voltage level.

17. The memory controlling method of claim 15, wherein generating the multi-pulse control signal with the first duration further comprises:

generating the single-pulse control signal with a second duration according to a clock signal; and generating the multi-pulse control signal according to the single-pulse control signal and a read signal.

18. The memory controlling method of claim 17, wherein the first duration of the multi-pulse control signal substantially equals the second duration of the single-pulse control signal.

* * * * *